United States Patent
Bryzek et al.

(10) Patent No.: US 7,518,493 B2
(45) Date of Patent: Apr. 14, 2009

(54) INTEGRATED TIRE PRESSURE SENSOR SYSTEM

(75) Inventors: Janusz Bryzek, Fremont, CA (US); Curtis Ray, Alamo, CA (US); Brian Lee Bircumshaw, Berkeley, CA (US); Elizabeth A. Logan, Danville, CA (US)

(73) Assignee: LV Sensors, Inc., Emeryville, CA (US)

( * ) Notice: Subject to any disclaimer, the term of this patent is extended or adjusted under 35 U.S.C. 154(b) by 352 days.

(21) Appl. No.: 11/292,946

(22) Filed: Dec. 1, 2005

(65) Prior Publication Data
US 2007/0125161 A1 Jun. 7, 2007

(51) Int. Cl.
B60C 23/00 (2006.01)
(52) U.S. Cl. .................... 340/442; 340/445; 340/447; 340/449; 340/539.1; 73/146.5
(58) Field of Classification Search .............. 340/442, 340/445
See application file for complete search history.

(56) References Cited

U.S. PATENT DOCUMENTS

| | | | |
|---|---|---|---|
| 6,066,989 A * | 5/2000 | Knecht et al. ................ 331/18 |
| 6,199,575 B1 | 3/2001 | Widner | |
| 6,259,361 B1 | 7/2001 | Robillard et al. ............ 340/447 |
| 6,278,363 B1 | 8/2001 | Bezek et al. ................. 340/442 |
| 6,407,484 B1 | 6/2002 | Oliver et al. ................. 310/339 |
| 6,463,798 B2 | 10/2002 | Niekerk et al. .............. 73/146.2 |
| 6,486,776 B1 * | 11/2002 | Pollack et al. ............... 340/521 |
| 6,571,617 B2 | 6/2003 | Van Niekerk et al. ......... 73/146 |
| 6,658,550 B2 | 12/2003 | Martin et al. | |
| 6,696,935 B2 | 2/2004 | Bonardi et al. .............. 340/447 |
| 6,725,713 B2 | 4/2004 | Adamson et al. ........... 73/146.5 |
| 6,731,205 B2 | 5/2004 | Schofield et al. ............ 340/444 |
| 6,762,077 B2 | 7/2004 | Schuurmans et al. ........ 438/112 |
| 6,868,731 B1 * | 3/2005 | Gatesman .................... 73/714 |
| 6,918,297 B2 | 7/2005 | MacGugan | |
| 6,935,169 B2 | 8/2005 | Newman et al. | |

(Continued)

OTHER PUBLICATIONS

"Thin Film Lithium and Lithium-ion Batteries", by J.D. Bates et al., published by Elsevier in Solid State Ionics, No. 135, on pp. 33-45, in the year 2000.

(Continued)

Primary Examiner—Donnie L Crosland
(74) Attorney, Agent, or Firm—Lumen Patent Firm

(57) ABSTRACT

The present invention provides a tire pressure sensor system that has multiple functions and is integrated into a small package. The system includes one or more Micro Electro Mechanical System (MEMS)-based sensors, including a MEMS-based pressure sensor; a MEMS-oscillator-based wireless signal transmitter; and a microcontroller, where the microcontroller processes the data generated by at least one of the MEMS-based sensors, controls at least one of the MEMS-based sensors, and controls the encoding and timing of transmission of data from the wireless signal transmitter. Preferably, the MEMS-based sensors, MEMS-oscillator-based wireless signal transmitter, and microcontroller are integrated onto one or more chips in one or more packages. The system also preferably includes a MEMS-based motion sensor, a low frequency (LF) receiver, an IC-based voltage sensor, a voltage regulator, a temperature sensor and a polarization voltage generator. Thus, the disclosed tire pressure sensor system is high in functionality, yet small in size.

32 Claims, 10 Drawing Sheets

U.S. PATENT DOCUMENTS

| | | | |
|---|---|---|---|
| 2002/0121132 A1 | 9/2002 | Breed et al. | ................... 73/146 |
| 2003/0006890 A1* | 1/2003 | Magiawala et al. | ......... 340/438 |
| 2005/0233788 A1 | 10/2005 | Manccosu et al. | |
| 2006/0185429 A1* | 8/2006 | Liu et al. | ................... 73/146.5 |

OTHER PUBLICATIONS

"Carbon Pillars Power Microbatteries", by S.R. Das and W.D. Jones, published in IEEE Spectrum Magazine, Oct. 2004, pp. 20-22.

"A single Chip Pressure Sensor for the Automotive Market", Jeffery G. Markle et al., Sensors Magazine, Apr. 2004 edition.

EE Times Online, "MEMS-IC Integration remains a challenge", by Janusz Bryzek, published online on Oct. 3, 2003 http://www.eetimes.com/in_focus/embedded_systems/OEG20031003S0042.

EE Times Online, "For mixed-signal, roll multiple MEMS dice", by D. Mladenovic and D.J. Monk, published online Oct. 3, 2003 http://www.eetimes.com/in_focus/embedded_systems/OEG20031003S0037.

"A Smart Tire Pressure Monitoring System", K. Mnif, published in Sensors, Nov. 2001.

"Pumped Up", by John DeGaspari, published in Mechanical Engineering, Apr. 2005.

"Sensors for Tire Monitoring Have A Key Growth Opportunities", Sensor Industry Developments and Trends, Sensor Business Digest, Sensors Online Dec. 2000 http://www.sensorsmag.com/resources/businessdigest/sbd1200.shtml.

"Wireless Sensors Eye Tire Pressure", David Marsh, Electronics Design News (EDN) Magazine, Sep. 2$^{nd}$ 2004, pp. 43-49.

"Vibrating RF MEMS for NextGeneration Wireless Applications", Clark T-C Nguyen, Invited Paper Session 13, Custom Integrated Circuits Conference (CICC) 2004, Oct. 3-6, 2004, Orlando, FL, published by IEEE.

"A 3-Axis Surface Micromachined ΣΔ Accelerometer", Lemkin, Mark A., ISSCC, 1997, Session 12.4.

"Atmel Raises the Bar on Tire Pressure Monitoring Systems", Levy, Markus p. 44-45 www.atmel.com.

"Electronic Tire Pressure Monitoring System" http://www.beru.com/english/home/index.php.

"MPXY8000 Series Tire Pressure Monitoring Sensor", Reodique, Ador, 2003. Archived by Freescale Semiconductor, Inc. http://www.freescale.com/files/sensors/doc/app_note/AN1954.pdf.

"SP12 TPM Sensor", Infineon Technologies SensoNor As, http://sni.nextframe.net/products/SP12.html.

"Tire Pressure Monitoring (TPM) System" Lourens, Ruan http://www.microchip.com/stellent/idcplg?IdcService=SS_GET_PAGE&nodeId=1824&appnote=en012044.

" LIS3L02AQ, Inertial Sensor: 3Axis-2g/6g Linear Accelerometer" http://www.st.com/stonline/products/literature/ds/9321.pdf.

"Small, Low Power, 3-Axis +2g iMEMS Accelerometer" http://www.analog.com/UploadedFiles/Data_Sheets/452160506ADXL330_pra.pdf.

"HT-80C51 Microcontroller" Handshake Solutions www.handshakesolutions.com.

Discera Micro Communication Technologies http://www.discera.com/secondary.asp?page=products.

"System in Package (SiP)" http://www.amkor.com/enablingtechnologies/SiP/AMKR_SiP.pdf.

"Pressure Sensor Ics-Hall Ics-Temperature Sensors" Infineon Technologies. www.infineon.com/sensors.

"MMA7260Q, 1.5g-6g Three Axis Low-g Micromachined Accelerometer." Freescale Semiconductor, Inc. http://www.freescale.com/files/sensors/doc/data_sheet/MMA7260Q.pdf.

* cited by examiner

| Pin | Signal | Pin | Signal |
|---|---|---|---|
| 1 | PAout | 24 | GND |
| 2 | PAgnd | 23 | Voltage regulator |
| 3 | GND | 22 | Battery |
| 4 | GND | 21 | INPUT/OUTPUT 1 |
| 5 | External capacitor | 20 | GND |
| 6 | Loop Filter | 19 | LF in |
| 7 | UART INTERFACE | 18 | INPUT/OUTPUT 2 |
| 8 | GND | 17 | INPUT/OUTPUT 3 |
| 9 | UART INTERFACE | 16 | INPUT/OUTPUT 4 |
| 10 | GND | 15 | Optional External Crystal 1 |
| 11 | External Capacitor | 14 | Optional External Crystal 2 |
| 12 | GND | 13 | GND |

FIG. 10

INTEGRATED TIRE PRESSURE SENSOR SYSTEM

FIELD OF THE INVENTION

The present invention relates generally to the field of tire pressure sensing. More particularly, the present invention relates to a highly integrated tire pressure monitoring and transmitting system.

BACKGROUND

Devices for monitoring tire pressure have been available for many decades, although the implementation of such devices in real-life applications has been rare. In recent years, however, as US Government legislation and consumer trends in automotive safety have driven the introduction of direct tire pressure monitoring systems, the design and manufacture of low cost, easily installed and vehicle systems-friendly devices have become key areas of development for automotive manufacturers and suppliers. Whereas some systems rely on visual indicators, the trend is towards systems that communicate wirelessly with a central vehicle operating system to provide real-time data to the vehicle operator. The concept of transmitting the information via wireless communications was conceived early and has now been adopted into many, if not all, modern tire pressure sensor systems (TPSSs). Such wireless systems require three main components: a means of sensing the tire pressure, a means of controlling the sensor and powering it up/down, and a radio transmitter/receiver.

Direct tire pressure monitoring systems are mounted with the pressure sensor inside or outside the tire of the vehicle and can be divided into three categories: i) systems that are attached to the wheel rim; ii) systems that are mounted on or in the tire itself; and iii) systems that are attached to the tire valve. Systems attached to the tire valve offer advantages in that they are easily installed and retrofitted and, if desired, the valve body can act as an antenna for the transmitter. Such systems, however, need to be as small and lightweight as possible. Otherwise, large locking systems are needed to retain the electronics and sensor in place and counterbalance weights are needed to keep the wheel in balance. For all three categories, increased size and weight relate directly to the increased failure rate of tire pressure monitoring systems during tire changes. Thus maintaining low size and weight are of great importance.

To keep the system small, manufacturers of tire pressure monitors have traditionally relied on providing a limited amount of information, related solely to the tire pressure, which is usually corrected for temperature by means of a temperature sensor. As tire pressure monitoring systems have become more sophisticated, however, the expectations of customers have increased, such that modern systems are expected to provide more features than a simple pressure reading, while maintaining a small format. Examples of additional features include providing tire location information and interrogation capability by a central module.

Manufacturers are resorting to a number of different approaches to achieve the desired functionality in a small format, either by combining individually packaged chips with separate functions into a module, or by increasing the level of integration in either the sensor or the integrated circuit (IC) or both. Such systems, however, still require multiple packages and additional components to achieve full functionality. Thus, many systems still rely on a bulky modular construction approach. Accordingly, there is a need in the art to develop a tire pressure sensor system that has the desired functionality, but is contained in a single small package.

SUMMARY OF THE INVENTION

The present invention provides a tire pressure sensor system that has multiple functions and is integrated into a small package. The system includes one or more Micro Electro Mechanical System (MEMS)-based sensors, including a MEMS-based pressure sensor; a MEMS-oscillator-based wireless signal transmitter; and a microcontroller, where the microcontroller processes the data generated by at least one of the MEMS-based sensors, controls at least one of the MEMS-based sensors, and controls the encoding and timing of transmission of data from the wireless signal transmitter. Preferably, the MEMS-based sensors, MEMS-oscillator-based wireless signal transmitter, and microcontroller are integrated onto one or more chips in one or more packages. The system also preferably includes a MEMS-based motion sensor and a low frequency (LF) receiver. The system further preferably includes an IC-based voltage sensor, a voltage regulator, a polarization voltage generator and an IC-based temperature sensor, although the temperature sensor could also be MEMS-based. Preferably, all MEMS-based sensors are capacitive and the microcontroller is an asynchronous microcontroller in order to reduce the power consumption of the system. The microcontroller preferably enables signal processing of data generated by the sensors. In addition, the system preferably includes a MEMS-based reference capacitor for enhancing the sensor performance. In a preferred embodiment, the tire pressure sensor system is associated with a power source, where the power source may be, but is not limited to, a battery, an energy scavenger or both. The power source may be integrated onto the one or more chips, integrated into the one or more packages, or outside of the one or more packages. The voltage regulator may be operably coupled to the power source to modify the output of the power source.

The MEMS-oscillator-based wireless signal transmitter preferably contains a MEMS-oscillator-based resonator for generating a desired output frequency, a fractional-N synthesizer to calibrate this output frequency, a microcontroller to encode the transmitted signal, and a power amplifier to amplify the signal and pass it to an antenna. Typically, the value of the frequency of the MEMS-oscillator-based resonator varies about ±20% in production and has a temperature coefficient of about +50 ppm/° C. and a polarization voltage coefficient of −500 ppm/V. Preferably, the fractional-N synthesizer decreases these variations to give a final frequency value that falls within FCC guidelines, the frequency and bandwidth of which is generally determined by the receiver of the in-vehicle system. Such a bandwidth is typically about ±100 ppm over a temperature range of about −40° C. to about 125° C. In a preferred embodiment, the fractional-N synthesizer is operably connected to the temperature sensor and the voltage sensor, and uses data from the temperature sensor and the voltage sensor to modify the output frequency generated by the MEMS-oscillator-based resonator. In addition, the MEMS-oscillator-based resonator may be operably connected to a programming interface for modifying one or more parameters of the output frequency generated by the MEMS-oscillator-based resonator.

BRIEF DESCRIPTION OF THE FIGURES

The present invention together with its objectives and advantages will be understood by reading the following description in conjunction with the drawings, in which:

FIG. 10 shows a pin-out diagram of a package according to the present invention.

DETAILED DESCRIPTION OF THE INVENTION

Figure 1:
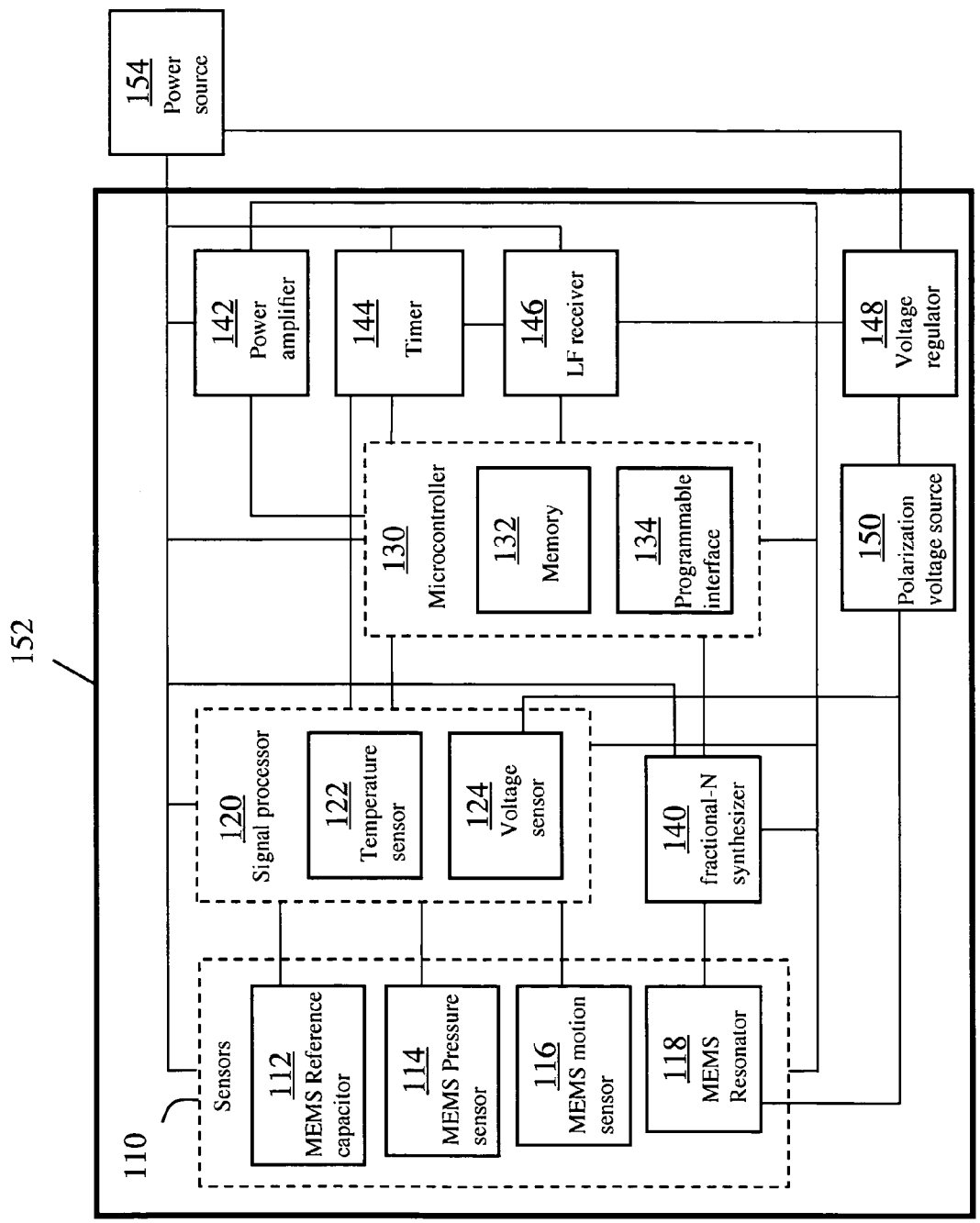
FIG. 1 shows an example of a tire pressure sensor system integrated onto one chip according to the present invention.

The tire pressure sensor system of the present invention may be integrated onto one or more chips. In one embodiment of the invention the tire pressure system is integrated onto one chip. A preferred aspect of this embodiment is shown in FIG. 1. In this aspect, sensors 110, including MEMS-based reference capacitor 112, MEMS-based pressure sensor 114, MEMS-based motion sensor 116 and MEMS-oscillator-based resonator 118; sensor signal processor 120, including temperature sensor 122 and voltage sensor 124; microcontroller 130, including memory 132 and programmable interface 134; fractional-N synthesizer 140, power amplifier and associated circuits 142, timer 144, LF receiver 146, voltage regulator 148 and polarization voltage generator 150 are integrated onto one monolithic chip 152. In addition, monolithic chip 152 is preferably connected to power source 154. Power source 154 may be part of a package (not shown) that contains monolithic chip 152 or it may be outside of the package. Alternatively, power source 154, may be integrated onto monolithic chip 152. The solid lines connecting components in this figure represent physical connections between the components.

In another embodiment, the tire pressure system is integrated onto two chips. In a preferred aspect of this embodiment, all of the MEMS-based components are integrated onto a first chip, and all of the CMOS-based components are integrated onto a second chip. In one example, shown in FIG. 2, sensors 210, including MEMS-based reference capacitor 212, MEMS-based pressure sensor 214, MEMS-based motion sensor 216 and MEMS-oscillator-based resonator 218 are co-fabricated onto one monolithic MEMS chip 220. A monolithic ASIC chip 230 contains sensor signal processor 240, including temperature sensor 242 and voltage sensor 244; microcontroller 250, including memory 252 and programmable interface 254; fractional-N synthesizer 260, power amplifier and associated circuits 262, timer 264, LF receiver 266, voltage regulator 268 and polarization voltage generator 270. In addition, ASIC chip 230 is preferably connected to power source 272. Power source 272 may be part of a package (not shown) that contains monolithic chips 220 and 230 or it may be outside of the package. Alternatively, power source 272, may be integrated onto MEMS chip 220 or ASIC chip 230. The solid lines connecting components in this figure represent physical connections between the components.

In yet another embodiment (not shown), the MEMS chip may be split into two or more chips.

Sensors

The MEMS-based tire pressure sensor may be any MEMS-based pressure sensor. The pressure sensor may be formed using a range of different technologies, such as piezo-resistive resonating, piezoelectric or, preferably, capacitive. The pressure sensor preferably has a short measurement time (under about 1 ms) and a low measurement current (under about 1 mA) to enable low battery drain.

The temperature sensor may be MEMS-based, but is preferably IC-based. The temperature sensor can preferably detect a temperature range from about −40° C. to about 125° C., with a resolution of about 1° C./lsb. Temperature measurement using this sensor preferably takes under about 1 ms. The temperature sensor preferably utilizes less than about 1 mA of current to make a measurement, with a measurement charge consumption of under about 1 μC. The output of the temperature sensor can be used to program a shut down of the entire IC to prevent inaccurate readings outside the calibrated range.

The MEMS-based motion sensor may be single-axis, dual-axis or tri-axial, preferably tri-axial. The motion sensor may be realized in a number of different technologies, such as piezoelectric, piezoresistive, resonating, thermal or capacitive. The motion sensor preferably has a measurement time of under about 1 ms and a measurement current of less than about 1 mA.

A tri-axial motion sensor (such as an accelerometer) allows sensing of motion to determine whether a vehicle containing the sensor is stationary. This information can in turn be used to power-down the integrated tire pressure sensor system. In addition, a tri-axial motion sensor, either alone or in conjunction with the temperature sensor, may form the basis of a tire location system. Such methods of determining tire location are described in the literature. A preferred tri-axial motion sensor is a monolithic multi-axis motion sensor, examples of which include those made by Analog Devices or ST Microelectronics.

Another preferred MEMS-based tri-axial motion sensor is based on the capacitive sensing method. In this sensor, a mass suspended over an electrode reacts to external motion in the Z direction by moving on support arms such that the distance between the bottom of the mass, which is conductive, and the electrode varies. The change in capacitance thus produced can be measured, where a capacitance change is indicative of motion. Motion in the Z direction is limited on the top by a cap and on the bottom by the electrode. This limitation in movement prevents excessive movement of the mass and prevents damage and breakage to the support arms. Anti-stiction bumps in the capacitive gap prevent the mass from sticking in the event that the mass makes contact with the cap or electrode.

The mass reacts to external motion in the X and Y directions by rotating in the direction of the motion, pivoting on the support arms. It is possible to detect this motion by means of a split electrode situated beneath the mass. By dividing this electrode into two, three, or four sections, for example, it is possible to tell in which direction the motion occurred, as different sections will be activated by different types of motion. As an example, consider an electrode in the shape of a square that is divided into four sections, where X increases from left to right, and Y increases from bottom to top. Increased capacitance in the right-most two sections of the square would indicate motion in the negative X direction. Increased capacitance in the top-most two sections of the square would indicate motion in the negative Y direction. A number of different electrode configurations may be generated by separating a bottom via layer into individual electrodes.

The voltage sensor is preferably an IC-based sensor. The voltage sensor is also preferably a dual range, 8-bit sensor that can sense a first voltage range from about 1.2 to about 4.0 V and a second voltage range that covers voltages up to about 15V. The resolution of the sensor is preferably about 10 mV/lsb on the lower range and the accuracy of the sensor is preferably about ±50 mV. The voltage sensor preferably includes a low battery detector that powers down the system when the battery voltage at the sensor is in the range of about 1.6 to about 2.2 V. The voltage sensor may also detect when the battery is discharged or cold, when it has a high internal resistance preventing transmission. In this case a supporting capacitor may be charged to assist with the transmission. This helps to prolong the usable battery life. The voltage sensor preferably has a measurement time of less than about 500 µs, a measurement current of less than about 500 µA, and a measurement charge consumption of about less than about 0.25 µC. IC-based voltage and temperature sensors are widely used in the industry and are available in a range of IC processing technologies such as Complementary Metal Oxide Semiconductor (CMOS), bipolar CMOS (BiCMOS), silicon-germanium (SiGe) and Bipolar.

Other sensors that may be included in the tire pressure sensor system include a MEMS-based gyroscope, a MEMS-based velocity sensor, a MEMS-based vacuum sensor, a MEMS-based force sensor, and/or a MEMS-based light sensor.

In addition to the sensors, the integrated tire pressure sensor system preferably has a MEMS-based reference capacitor for compensating the sensors for common mode effects such as temperature. The reference capacitor is formed using a very similar structure to the sensors. It therefore changes in capacitance due to temperature, motion, etc., in the same manner as the sensors and hence the value of capacitance from this capacitor can be used to compensate for these effects when measuring the output of the other sensors. For example, the reference capacitor can have the same structure as the pressure sensor but not be affected by pressure, having no opening to the external environment. This means that the effects of temperature, etc., can be measured on the reference capacitor and subtracted from the measurement of the pressure sensor, so that only the pressure effects are considered. The reference capacitor also allows the system to make differential measurements, which reduces the sensitivity to battery voltage changes.

Signal Processor

The integrated tire pressure sensor system preferably includes a sensor signal processor. The signal processor allows the integrated tire pressure sensor to combine input from multiple sensors and process data from the different sensors. The signal processor is preferably compatible with capacitive sensors, such as the pressure and motion sensors; junction sensors, such as the temperature sensor; and voltage and resistive sensors. The signal processor preferably provides sensor compensation with a compensation algorithm, and makes provisions for ratiometric output for each sensor. The signal processing preferably includes sensor signal conditioning (including information extraction from the sensor, calibration and temperature compensation) and data processing by a microcontroller (which can operate from routines programmed into memory). Extraction of information from the sensor may be performed by any one of a number of well known techniques, such as a sigma-delta converter and its associated elements.

Sensor capacitance can be defined by the following simplified relationship:

$$C = \varepsilon * \frac{A}{K_1(T) + K_2(T)*P}$$

where $\varepsilon$ is a dielectric constant, A is the area of the electrode, $K_1$, and $K_2$ are sensor specific constants dependant on temperature, and P is pressure.

In a differential configuration a signal will be generated by two capacitors: a sense capacitor with $K_2 > 0$, and a reference capacitor with $K_2 = 0$. The constants $K_1$ will be different for the sense and reference capacitors. In addition, all constants will vary between different devices due to variations introduced in production.

The differential signal supplied to sensor electronics can be defined as:

$$Cp - Cref = \varepsilon * A * \left( \frac{1}{K_{1P}(T) + K_{2P}(T)*P} - \frac{1}{K_{1REF}(T)} \right)$$

where the subscripts P and REF refer to the sense and reference capacitors, respectively.

Sensor Calibration

The objective for calibration is to deliver expected accuracy (e.g., ±1% of full scale output (FSO)) at reference (room) temperature independently of the values of constants $K_1$ and $K_2$. The calibration could be performed, e.g., at two absolute pressures $P_0$ and $P_{FS}$, for example at 100 kPaA representing zero and 450 kPaA representing full scale for the basic pressure range (different pressure ranges could have a different dimension of active silicon diaphragm or a different gain of electronics). Calibration is equivalent to solving a set of simultaneous equations:

$$\left. \begin{array}{l} \varepsilon * A * \left( \frac{1}{K_{1P}(T) + K_{2P}(T)*P_0} - \frac{1}{K_{1REF}(T)} \right) = CAL_0 \\ \varepsilon * A * \left( \frac{1}{K_{1P}(T) + K_{2P}(T)*P_{FS}} - \frac{1}{K_{1REF}(T)} \right) = CAL_{FS} \end{array} \right\}$$

where $CAL_0$ and $CAL_{FS}$ are target calibrated sensor outputs at $P_0$ and $P_{FS}$, respectively.

It should be pointed out that the calibration equations are not orthogonal:

Zero output ($CAL_0$) depends on both $K_1$ (offset) and $K_2$ (sensitivity) constants Full scale output ($CAL_{FS}$) depends on both constants as well.

This requires an iterative calibration process if a direct setting of the output during the calibration process is implemented. A more efficient process is to perform a measurement of the output at both pressures, then calculate the required correction constants by solving the set of simultaneous equations.

The set of calibration equations has 2 equations and 3 sensor constants. The third equation could be derived from the condition to match the sense and reference capacitor outputs at 0 kPaA:

$$\frac{1}{K_{1P}(T)} = \frac{1}{K_{1REF}(T)}, \text{ thus } K_{1P}(T) = K_{1REF}(T)$$

Sensor Temperature Compensation

The objective of temperature compensation is to meet the temperature error specification. There are several options for temperature compensation:

If temperature errors are small enough, one can eliminate temperature compensation.

If temperature errors are predictable with a sufficient accuracy, one can implement a statistical compensation, where predicted temperature errors will be compensated without temperature testing.

If temperature errors are not predictable, sensors must be tested at different temperatures to measure temperature errors. If temperature errors are linear, two test temperatures are needed. For parabolic errors at least three test temperatures are needed, etc.

It is expected that compensating the linear component of temperature errors is sufficient to achieve required performance for tire pressure sensors, thus:

$$K_{1p}(T) = X_0 + X_1 * T$$

$$K_{2p}(T) = Y_0 + Y_1 * T$$

In such a case, compensation and calibration can be achieved by solving a set four simultaneous equations calibrating zero and full scale at two temperatures $T_1$ and $T_2$ by finding constants $X_0, X_1, Y_0, Y_1$:

$$\left. \begin{array}{l} \varepsilon * A * \left( \frac{1}{K_{1P}(T_1) + K_{2P}(T_1) * P_0} - \frac{1}{K_{1REF}(T_1)} \right) = CAL_0 \\ \varepsilon * A * \left( \frac{1}{K_{1P}(T_2) + K_{2P}(T_2) * P_0} - \frac{1}{K_{1REF}(T_2)} \right) = CAL_0 \\ \varepsilon * A * \left( \frac{1}{K_{1P}(T_1) + K_{2P}(T_1) * P_{FS}} - \frac{1}{K_{1REF}(T_1)} \right) = CAL_{FS} \\ \varepsilon * A * \left( \frac{1}{K_{1P}(T_2) + K_{2P}(T_2) * P_{FS}} - \frac{1}{K_{1REF}(T_2)} \right) = CAL_{FS} \end{array} \right\}$$

Specific calibration/compensation implementation depends on the circuit implementation.

The calibration constants used by the signal processor are preferably stored in more than one memory location, e.g. electronically erasable programmable read-only memory (EEPROM) or FLASH, to provide an option for cross-checking potential memory corruption.

The signal processor may use data from the temperature sensor and the tri-axial motion sensor to determine the location of a tire on a vehicle. For example, axial acceleration differs by 180° between the left and right sides of the car, and the temperature of the front wheels is typically different to that of the rear wheels. The signal processor may also determine whether a tire is in use or is a spare (i.e. no radial acceleration) and whether a vehicle containing the integrated tire pressure sensor system is moving (i.e. radial acceleration >0). The signal processor accomplishes these tasks by monitoring the sensors and sending the information from the sensor outputs to a central controller within the vehicle. The central controller is able to compare the signals from the different tires and determine which tire corresponds to which location. Descriptions of how this is achieved are widely available in the literature (see, e.g., U.S. Pat. Nos. 6,278,363, 6,463,798, 6,571,617, 6,696,935, 6,731,205 and 6,259,361).

Control System

The integrated tire pressure sensor system is controlled by a microcontroller, preferably an asynchronous microcontroller. This microcontroller processes the data generated by the sensors, controls the power applied to different blocks, and controls the encoding and timing of transmission of data. The microcontroller turns on only the blocks that need to be operating for a given function, allowing for lower power consumption of the system. These functions could be performed by any type of microcontroller. However, in addition to saving power by switching on and off different functions, the asynchronous microcontroller is able to reduce power consumption by the method of its internal operation. In a synchronous controller, all parts of the microcontroller (all gates) switch on and off with the clock. This happens irrespective of whether the functions performed by those gates are required at that particular time and so power is used to switch unused gates. In an asynchronous microcontroller, only the gates in the blocks that are in use are switched on and so the unused gates are not powered up, hence achieving considerable power savings.

Asynchronous microcontrollers useful for this invention include, but are not limited to, the Handshake HT80C51. The microcontroller preferably has an 8-bit or equivalent core, about 128-256 bytes of RAM, about 128-256 bytes of non-volatile calibration memory, about 8-16 kB of FLASH and/or EEPROM memory, and/or about 4-16 kB of ROM. The microcontroller preferably is complemented by a clock, a watchdog timer, and an LF wakeup trigger. Preferably, the transmission code, measurement interval, and transmission interval are programmable. The microcontroller preferably uses a supply current of less than about 100 µA when running at 1 MHz, and less than about 1 nA of current when in standby mode. The microcontroller preferably can operate on a supply voltage from about 1.6 V to about 3.6 V.

The microcontroller is preferably programmed to operate in a different manner depending upon its sensory input. In a typical tire pressure system there are two main modes of operation, standby and operation.

In standby, the tire pressure system is on the shelf and all of the system is in sleep mode apart from the timer on the ASIC, which turns on LF Receiver circuits on the chip periodically, for example about once every 5 sec. The LF circuit requires an external antenna coil, which is generally not included as part of the packaged tire pressure system.

The module is "woken" by an operator using an LF signal when the tire is put into use. At this time the module goes into operating mode and may power up the microcontroller and RF sections of the ASIC, including the fractional-N synthesizer and the MEMS-oscillator-based resonator on the MEMS chip to send a return signal if required by the customer system. In other implementations a simple wake command is issued and no transmission is required.

Once in operating mode, the timer wakes the LF and acceleration portions of the circuitry periodically, for example about once every 1-3 seconds, to check if there are any signals from the motion sensor, indicating that the vehicle has started to move, or the LF, indicating that an operator is about to program or send/request data (for example during tire changes). If the vehicle is in motion, the timer wakes the other parts of the ASIC, including the microcontroller, and takes a measurement of the sensor readings on a periodic basis, for example, once per second.

This data may be processed by the microcontroller or sent directly. For data to be sent, the ASIC wakes up the resonator and synthesizer to generate the signal upon which the RF portion of the ASIC chip depends. The microcontroller may be programmed to send data only when the tire pressure reaches a particular value. Alternatively, it may send data every time a measurement is taken. The exact measurements taken and transmission sequence is specific to each vehicle system and care must be taken to minimize transmission time and maximize intervals between transmissions in order to reduce the power required by the system. The most power intensive function is the transmission of data and this must be kept to a minimum.

Transmitter System

The transmitter system is made up of several blocks, a MEMS-oscillator-based resonator, a fractional-N synthesizer, a microcontroller-based encoder and a power amplifier (PA) to amplify the signal generated by the fractional-N Synthesizer. Preferably, the PA contains a power control, operably connected to the voltage sensor, to adjust and limit PA output power when the battery is fresh to save battery energy. The resonator may be based upon a vibrating, micromachined silicon mass, for example a beam, disc, diaphragm, annulus, polyhedron, or other geometries. Designs, methods of manufacture, as well as the theory of operation of using a beam or other vibrating MEMS structures to generate signals of a desired frequency are known in the art.

Resonators fabricated in this manner can have a certain amount of temperature dependence as well as, in cases where an applied bias is used, dependence on the applied bias voltage, often called the polarization voltage. The polarization voltage is generated by a polarization voltage generator and is typically higher than the supply voltage. The polarization voltage may be generated by a switch capacitor circuit. Such circuits are widely available in the industry, for example, for generating the write voltage for EEPROM memory. Furthermore, depending upon process tolerances, the resonator's resonant frequency may deviate from the desired frequency. An integrated circuit therefore takes the signal from the resonating structure and modifies it to give the desired frequency by using a fractional-N synthesizer. A fractional-N synthesizer allows the input frequency to be multiplied by a non-integer number so that variations in the output frequency of the resonator can be calibrated. This number is derived by the microcontroller using factory resonator calibration data in an approach analogous to the compensation of the pressure sensor outlined above. As an example, the number could be derived by solving a set of simultaneous equations to make output frequency equal to a desired value, based on measured resonator-based frequency at one or more temperatures during a calibration phase. Polarization voltage effects can be corrected in a like manner by taking the signal from the voltage sensor, calculating a correction in the microcontroller and feeding this data into the synthesizer. The MEMS-based resonator will typically have a production frequency tolerance of about +/−20%, a temperature coefficient of about +50 ppm/° C. and a polarization voltage coefficient of approximately −500 ppm/V. The fractional-N synthesizer may convert this output to a frequency value that varies by a small amount, typically about 100 ppm over a temperature range of about −40° C. to about 125° C. and a polarization voltage of about 12V to about 15V.

The synthesizer can therefore provide the correct frequency output regardless of original resonator frequency, operating temperature and polarization voltage effects. This combination of a MEMS-oscillator-based resonator and the use of a fractional-N synthesizer on the integrated circuit allow the small MEMS-oscillator-based resonator to be incorporated into the integrated wireless tire pressure sensor system. It should be noted, however, that the fractional-N synthesizer could equally be used with an external resonator. In this case, the fractional-N synthesizer allows a lower accuracy, lower cost, external resonator to be used and calibrated in a similar manner to that described above. A system without the fractional-N synthesizer is possible, but would necessitate the use of a highly accurate, more costly resonator.

Power Source

The integrated tire pressure sensor system preferably is associated with a power source. The power source may be on- or off-chip and within or outside the tire pressure sensor system package. The power source may be an energy scavenging system, a battery, or both. The battery may be, for example, a CR1632 or a CR2450. Alternatively, the battery may be a thin film battery, as described in "Thin Film Lithium and Lithium-ion Batteries", by J. D. Bates et al., published by Elsevier in Solid State Ionics, No. 135, on pages 33-45, in the year 2000. The battery may also be a MEMS-based microbattery, as described in "Carbon Pillars Power Microbatteries", by S. R. Das and W. D. Jones, published in IEEE Spectrum Magazine", October 2004, pages 20-22. The energy scavenger may be any system that scavenges energy, including but not limited to those that scavenge energy from tire vibration, tire flexing, tire motion, and tire pressure. It may also be captured and converted electromagnetic energy, such as the 125 kHz signal used for waking up the tire pressure sensors, or energy at other frequencies such as 2.4 GHz. See U.S. Pat. Nos. 6,407,484 and 6,725,713 for examples of energy scavengers useful in tire pressure sensors.

The power source may be connected to a voltage regulator, which in turn may be connected to a voltage sensor. The voltage regulator may regulate voltage to the chip circuitry to reduce operating energy. Such voltage regulators are frequently used in electronic circuits and their design and operation are known in the art.

Receiver

In one embodiment of the invention, the integrated tire pressure sensor system also includes a receiver. The receiver may be composed of low frequency (LF) coil(s) (antenna), an LF decoder with low power detection of signal presence, and a controller for decoding the received signal. In general the detection circuits test for the presence of a 125 kHz (LF) signal; and, once it is detected, look for a specific pattern. There are a number of protocols for LF detection described in the literature that may be implemented in the receiver. One example, which has been developed for tire pressure systems by Atmel, is described in their literature on the associated device (e.g., ATA5275).

Fabrication of an Integrated MEMS Chip

In one example, the integrated monolithic MEMS chip is formed from three wafers, 1) a cap wafer, 2) a sensor wafer, and 3) a via wafer. Preferred wafer materials are similar in thermal coefficient of expansion, so as to reduce thermally induced stresses. A preferred material, including but not limited to single crystal silicon, also reduces residual stress. In a preferred embodiment, the first wafer is a standard silicon wafer, used as a cap wafer; the second, or sensor, wafer is a buried oxide silicon-on-insulator (SOI) wafer used to form the transducer structures; and the third wafer is also an SOI wafer. This third wafer is used to form vias, which provide electrical connections to the device, and also preferably forms part of the transduction mechanism of the device. Each wafer is preferably processed individually before being bonded into the stacked structure, but processing may also be done subsequent to the bonding process. Although the wafers are described as cap, via and sensor, it is clear that different masking steps and designs can lead to different functions within each of these wafers.

In a preferred embodiment, the three-wafer design enables packaging of the sensors at a device level; i.e., the cavities are sealed, such that subsequent processing and assembly, such as dicing, can be carried out without damaging the devices. The structure also preferably allows the incorporation of features such as proof masses, stiffening and stress isolation structures and also incorporates the ability to form nanogaps. Precision etch stops using the buried oxide may be used to allow for precise fabrication of the devices. In addition, the design preferably allows fabrication of a MEMS chip that is between about 0.5 mm$^2$ and about 2.5 mm$^2$ in size.

Figure 2:
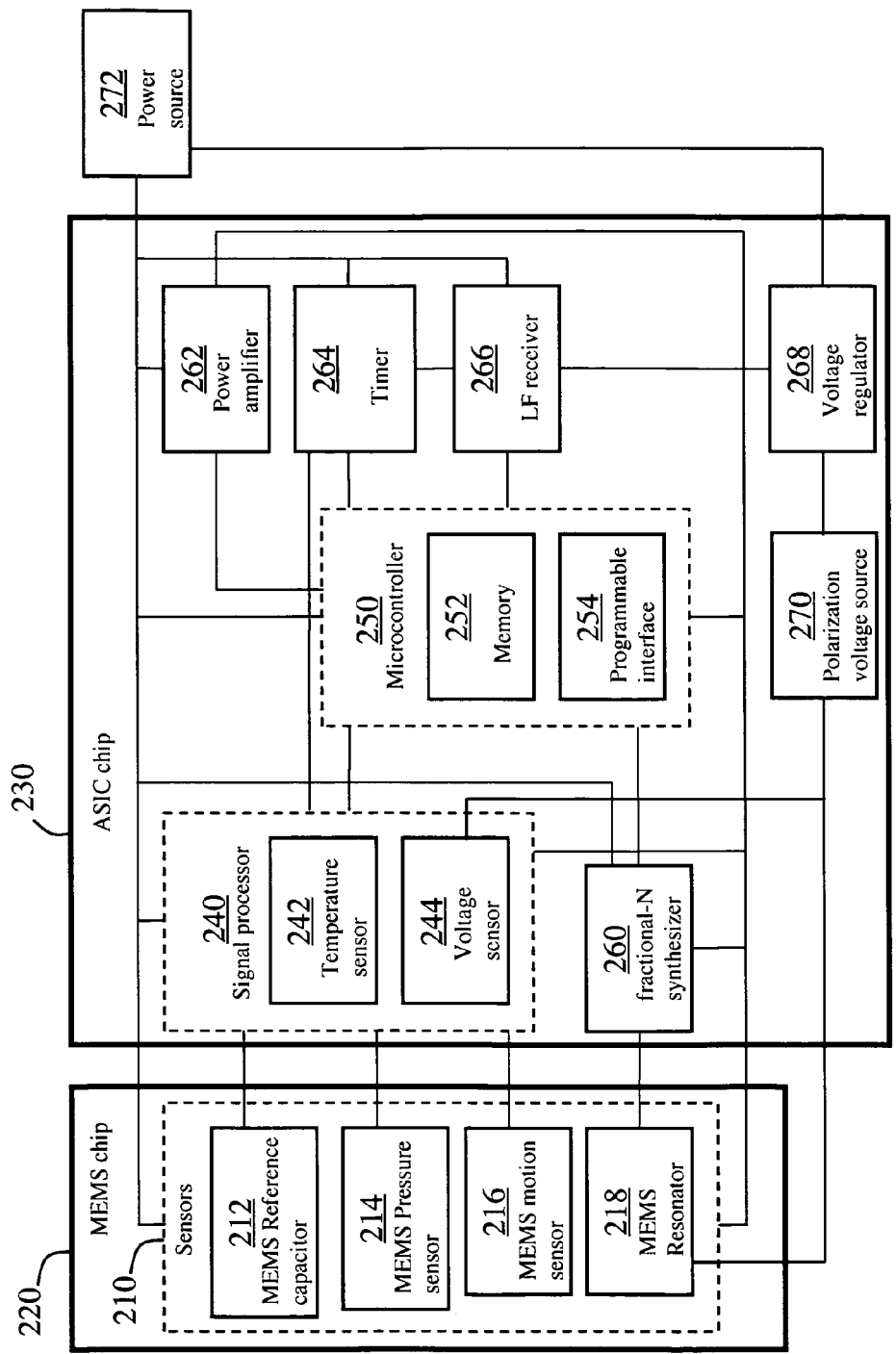
FIG. 2 shows an example of a tire pressure sensor system integrated onto two chips according to the present invention.

The following text describes preferred fabrication steps involved in producing the integrated monolithic MEMS chip of FIG. 2 using a three-wafer stack. It will be appreciated that many variations to the process steps, materials and processes described are possible and within the scope of the invention. The MEMS sensors described in this embodiment are preferably capacitive in nature, but other types of sensors such as piezoresistive, resonating, thermal, or piezoelectric could also be incorporated into this structure by means of modifications to the mask design and/or materials set used for the different layers. The described structure allows both in-plane and out-of plane transduction with six degrees of freedom (±x, ±y, and ±z). It is this capability that allows the fabrication of a resonator, with a vertical transduction gap, as well as pressure and tri-axial motion sensors, which have horizontal transduction gaps. Although in the preferred embodiment the MEMS devices include a pressure sensor, motion sensor, resonator and reference capacitor, it will be appreciated by those familiar with MEMS structures that the process described below can also be used to create other types of sensors such as a gyroscope, velocity sensor, vacuum sensor, force sensor and light sensor by simple changes in design or materials.

The via wafer is used to form the horizontal transduction gaps, bottom electrodes and electrical contacts for the capacitors and provides mechanical anchoring for the resonator and motion sensor. Via wafer 300, shown in FIG. 3A, is made of silicon 302 with a buried oxide layer 304. The buried oxide layer 304 is at approximately a 30 µm depth below the wafer surface. Methods of forming such wafers are well established and wafers can be purchased with the oxide layer already in place.

Figure 3:
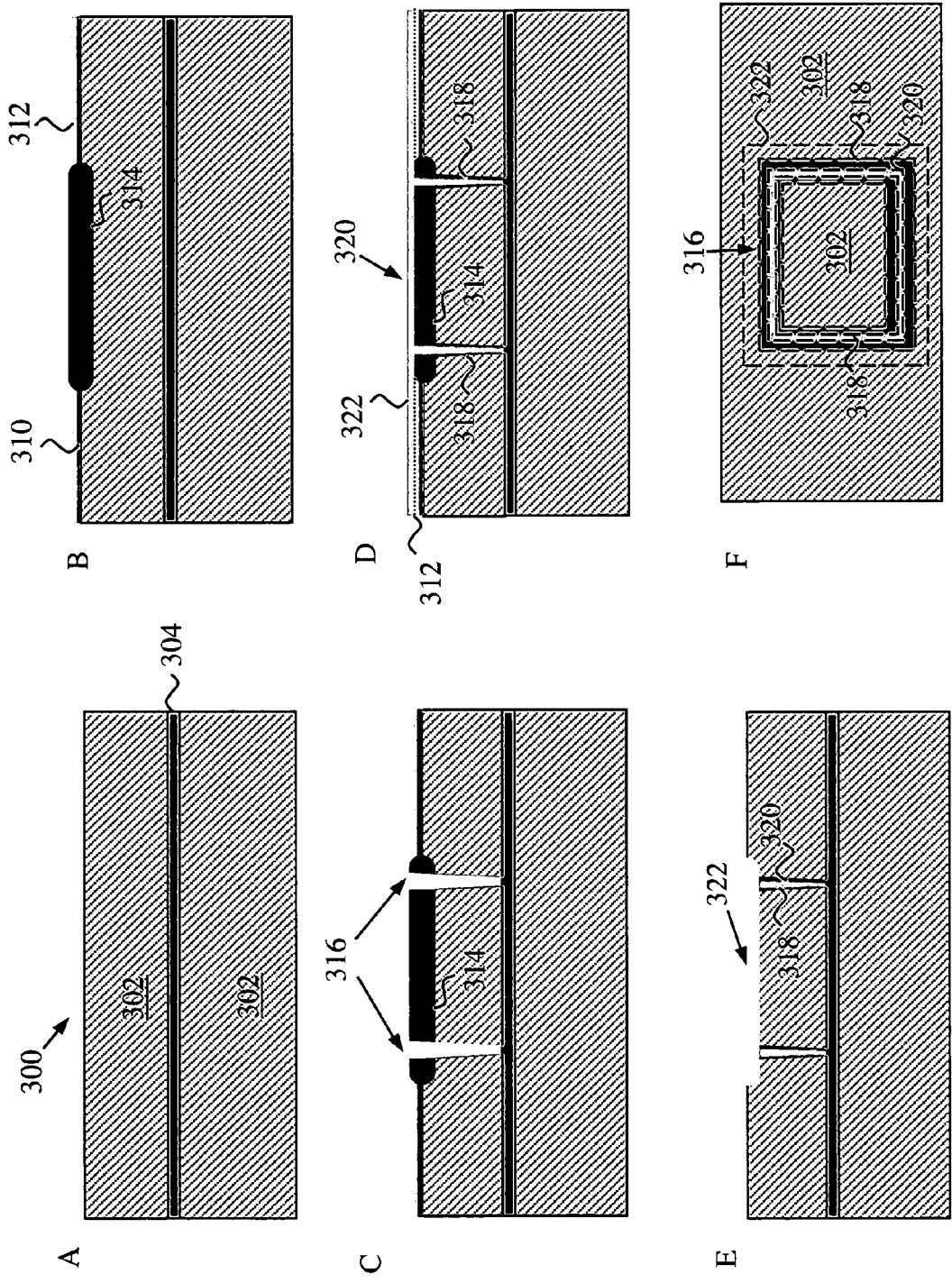
FIGS. 3-7 show fabrication of an integrated MEMS chip according to the present invention.

FIG. 3(B-E) illustrates steps involved in processing via wafer 300, with each figure showing a cross-section of a relevant portion of via wafer 300. The first step in processing via wafer 300, shown in FIG. 3B, is to define a cavity that will separate the two electrodes of a capacitive sensor. A thermal oxide layer 310 of approximately 3000 Å is formed on the surface of wafer 300 by wet thermal oxidation, followed by deposition of a silicon nitride layer 312 by conventional techniques such as LPCVD (low pressure chemical vapor deposition) or PECVD (plasma enhanced chemical vapor deposition). The nitride is used as a masking layer and is patterned using conventional photolithographic techniques to expose the oxidized wafer in areas where the cavities are to be formed. The exposed areas are subjected to further thermal oxidation 314. The depth to which this oxide forms is very controllable and oxidation is performed until the oxide reaches a depth of approximately 0.3 µm.

The next step, shown in FIG. 3C, is to form vias in the wafer 300. The oxide 314 is patterned using conventional photolithographic techniques to expose the oxide in areas where the trenches separating the electrical vias are to be formed. The oxide is removed in these areas using a dry etch technique such as reactive ion etching using a plasma containing, for example, $CF_4$ and $CHF_3$. At this point, trenches 316 for the vias in the silicon are etched using a deep reactive ion etch technique, a process well understood by those skilled in the art, until the etch process stops on the buried oxide layer 304, 30 µm below the surface of the wafer 300. In a preferred embodiment (not shown), the trenches are constructed in a ring configuration to separate the sensor silicon from surrounding silicon that may be used for other electrical contacts. This results in a narrow ring of electrically isolated silicon, called a guard ring, that surrounds the silicon forming, for example, the sensor bottom electrode and bottom electrode contact. The guard ring itself has an electrical contact and is driven to be at the same potential as the sensor silicon that it is guarding, protecting the sensor area from stray capacitance.

To fill the trenches, FIG. 3D, the wafer 300 is oxidized further using a wet thermal oxidation process until the oxide 318 reaches a depth of approximately 0.7 µm. The remaining gap in the trenches is filled by performing a blanket deposition of approximately 0.3 µm of polysilicon 320 using conventional deposition techniques, in which a conformal layer can be achieved.

The polysilicon and nitride above the trenches is then removed (FIG. 3E). Conventional wet or dry etch techniques can be used. These processes remove the original silicon nitride masking layer 312 and the portion 322 of polysilicon layer 320 that is on the surface of wafer 300, leaving behind the polysilicon 320 in the vias. Prior to bonding to another wafer, oxide 314 is removed using a wet HF etch, leaving behind recesses 322 in the wafer 300 surface where the capacitor cavity is to be located. A top view of a section of processed via wafer 300 is illustrated in FIG. 3F, with dashed lines indicating depressions in the wafer. FIG. 3F shows recess 322, and rectangular trench 316, which is filled with one layer of polysilicon 320 and two layers of silicon oxide 318.

Figure 4:
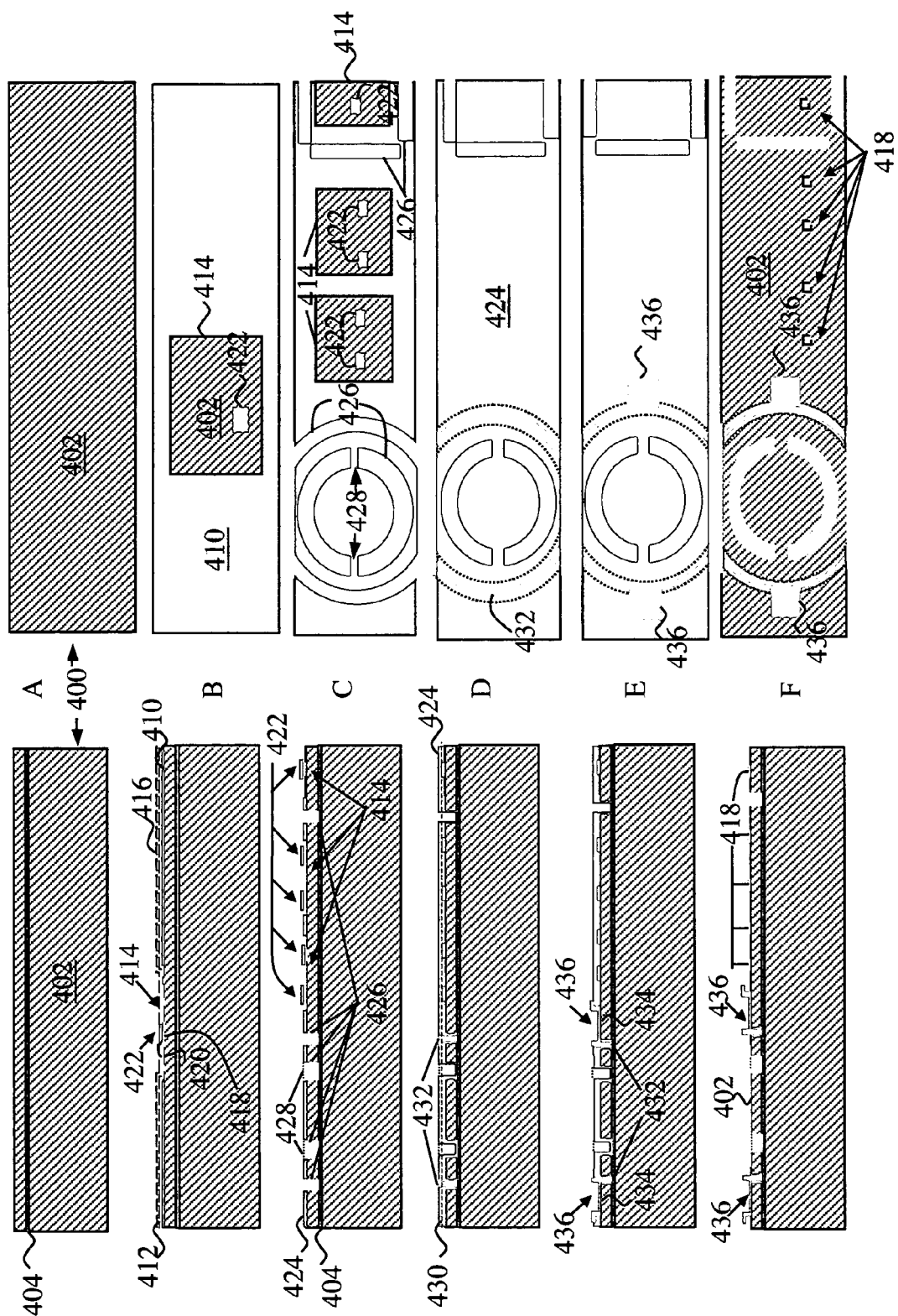

The second wafer to be processed is the sensor wafer, relevant portions of which are illustrated in FIG. 4. In FIG. 4 (A-F) the left-hand column in the figure illustrates cross sectional views and the right-hand column illustrates top views of the processing steps. Sensor wafer 400 has a buried oxide insulating layer 404, typically about 7 µm below the wafer surface, in silicon 402 (FIG. 4A). The wafer 400 is initially protected by forming a layer of oxide 410 approximately 1000 Å in thickness. This can be performed by thermal oxidation, as with the via wafer, or by deposition techniques such as PECVD. The oxide layer 410 is patterned using conventional photolithographic techniques to define small areas in the region, which will form capacitor cavities. These areas will ultimately give structures that prevent sticking of the electrodes, should the two come into close contact. The oxide is etched in these areas leaving small openings, such as opening 414 illustrated in FIG. 4B, in the oxide layer. Approximately 3000 Å of low stress silicon nitride (indicated by dashed line 412) is then deposited by conventional techniques such as LPCVD or PECVD and a hard masking layer, for example PECVD oxide, is deposited on top (indicated by dashed line 416). Photolithography is used to leave an oxide mask to protect the nitride, in the form of small dots within the original oxide openings. The silicon nitride is then etched using a wet etch, for example phosphoric acid. This leaves small nitride structures, such as 418, with oxide caps 420, which form anti-stiction bumps, such as 422.

The next step is to fabricate the resonator body, resonator gap and motion sensor suspension. The wafer 400 is patterned and the oxide layer 410 on the wafer surface is etched to provide a hard oxide mask 424 (FIG. 4C). The photoresist remains to protect the areas around the anti-stiction bumps 422. The silicon wafer is then etched using deep reactive ion etching until the etch reaches the insulating layer 404 at approximately 7 µm in depth. The etch must be controlled to give vertical sidewalls of trenches 426. Partial openings are indicated by dotted lines 428 in the cross sectional view.

To define the resonator gap, the wafer 400 is covered with a uniform, conformal oxide coating 430 using thermal oxidation of the silicon (FIG. 4D). The film must be pinhole free and is grown to a thickness that determines the final resonator gap, in this case 80 nm. The wafer 400 is then coated with a layer of polysilicon 432, deposited by any conventional process capable of producing a conformal, conductive layer, for example LPCVD. The thickness of the polysilicon is chosen to be able to fill the small gaps in the resonator structure, in this case 1 µm. The polysilicon 432 is then etched using an isotropic etch with good selectivity to oxide so that oxide mask 424 and oxide coating 430 remain at the end of the process. Typically a dry etching process, such as an $SF_6/O_2$ chemistry is chosen.

Before the resonator can be released, the polysilicon must be attached to the main bulk of the wafer (FIG. 4E). First openings 434 are made in the existing oxide mask 424 and conformal oxide coating 430 to expose the silicon surface and the top of the polysilicon fill 432. This is done by using photolithography and a dry etch in a similar manner to the processes described earlier. A second layer of polysilicon 436 of approximately 3000 Å in thickness is then deposited using standard deposition techniques. Using conventional photolithography and a suitable etch, for example that used for the previous polysilicon layer, the new polysilicon layer 436 is patterned to provide localized mechanical and electrical connectivity between the silicon surface and the top of polysilicon fill 432.

The remaining oxide mask 424, conformal oxide coating 430, and oxide caps 420 are removed prior to bonding by using a wet etch such as HF (FIG. 4F). This removes the surface oxide layers used in the masking steps and leaves a clean silicon surface 402, with polysilicon structures 436, separated from silicon 402 by oxide, and small nitride structures 418.

Figure 5:
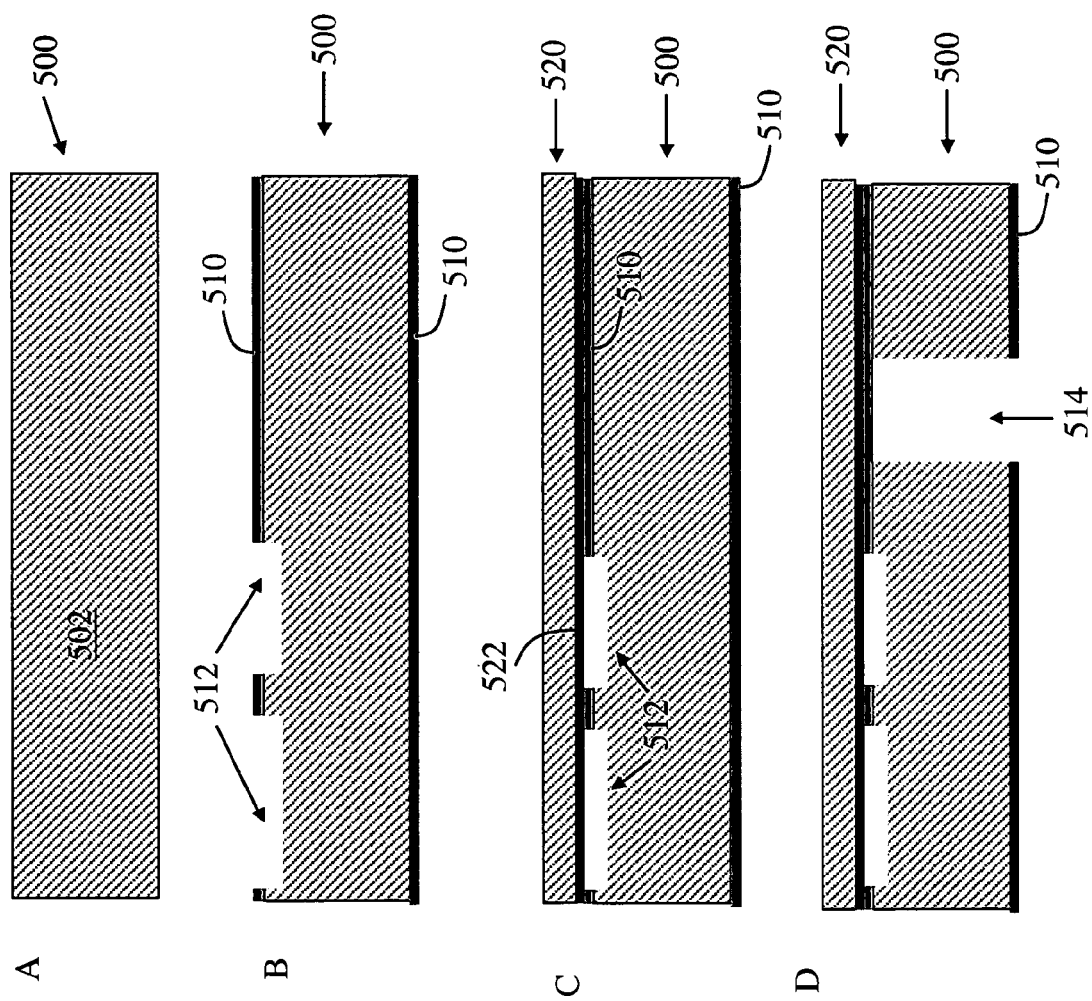

The final of the three wafers to be processed is the cap wafer 500 (illustrated in FIG. 5). The cap wafer 500 provides protection to those sensors requiring a sealed environment and also defines the cavity in which the moving masses are located. A starting wafer (not shown) is thinned to approximately 360 µm thick silicon wafer 502. Silicon wafer 502 is first oxidized using standard thermal oxidation techniques to give an approximately 3000 Å oxide layer 510. The oxide is patterned using photolithographic techniques and etched using a standard etching technique. The silicon is then dry etched using either reactive ion etch or deep reactive ion etch using well known techniques and appropriate timing to achieve a specified depth of etch 512 into the silicon, in this case 1 µm.

At this stage, cap wafer 500 is supported on a handling wafer 520 to prevent damage to equipment during through hole etching. The handling wafer 520 may be a dummy silicon wafer and a layer 522 is applied to the wafer 520 that will adhere to the cap wafer 500 but which can be released at a later stage, for example a photoresist.

The next processing steps are performed on the reverse side of the cap wafer 500 (FIG. 5D). These steps provide features that define openings that will allow the sensors to contact the external environment, for example the opening for the pressure sensor. The oxide on the surface of the wafer 500 is patterned using photolithographic techniques to define openings in the wafer 500. Deep reactive ion etching is used to etch a hole 514 through the entire wafer 500, and then the handling wafer 520 is removed (not shown). The attachment and de-bonding of handling wafers is well established and is therefore not described in detail. In preparation for bonding, the oxide layer is removed form the cap wafer and the surface is prepared for silicon-to-silicon fusion bonding as described previously.

The via wafer 300 and sensor wafer 400 are now prepared for bonding. Many variations on the preparation process are used but typically such a step would involve a surface modification process such as a sulfuric acid dip or oxygen plasma. Silicon-to-silicon fusion bonding under vacuum is used to join the two wafers. Such bonding techniques are well established. For the resonator to work effectively, the bonding process must be capable of bonding areas of the order of 20 µm in diameter. After bonding, the back side of the sensor wafer is ground and polished to a thickness of 100 µm with a mirror finish, suitable for silicon-to-silicon fusion bonding.

The new (combined) wafer is thermally oxidized (FIG. 6A) to give a surface oxide layer 610 of approximately 3000 Å using processes previously described. The new surface of the sensor wafer 400 is now processed (FIG. 6B) to give a mass 612 for the motion sensor, a stiffening block 614 for the pressure sensor, a stiffening block 616 for the reference capacitor and also to open a hole 618 to allow the processing of the resonator to be completed. This is achieved by photolithography, wet etching of the oxide layer to create an oxide mask and deep reactive ion etching of sensor wafer 400 using processes already described in previous steps.

Figure 6:
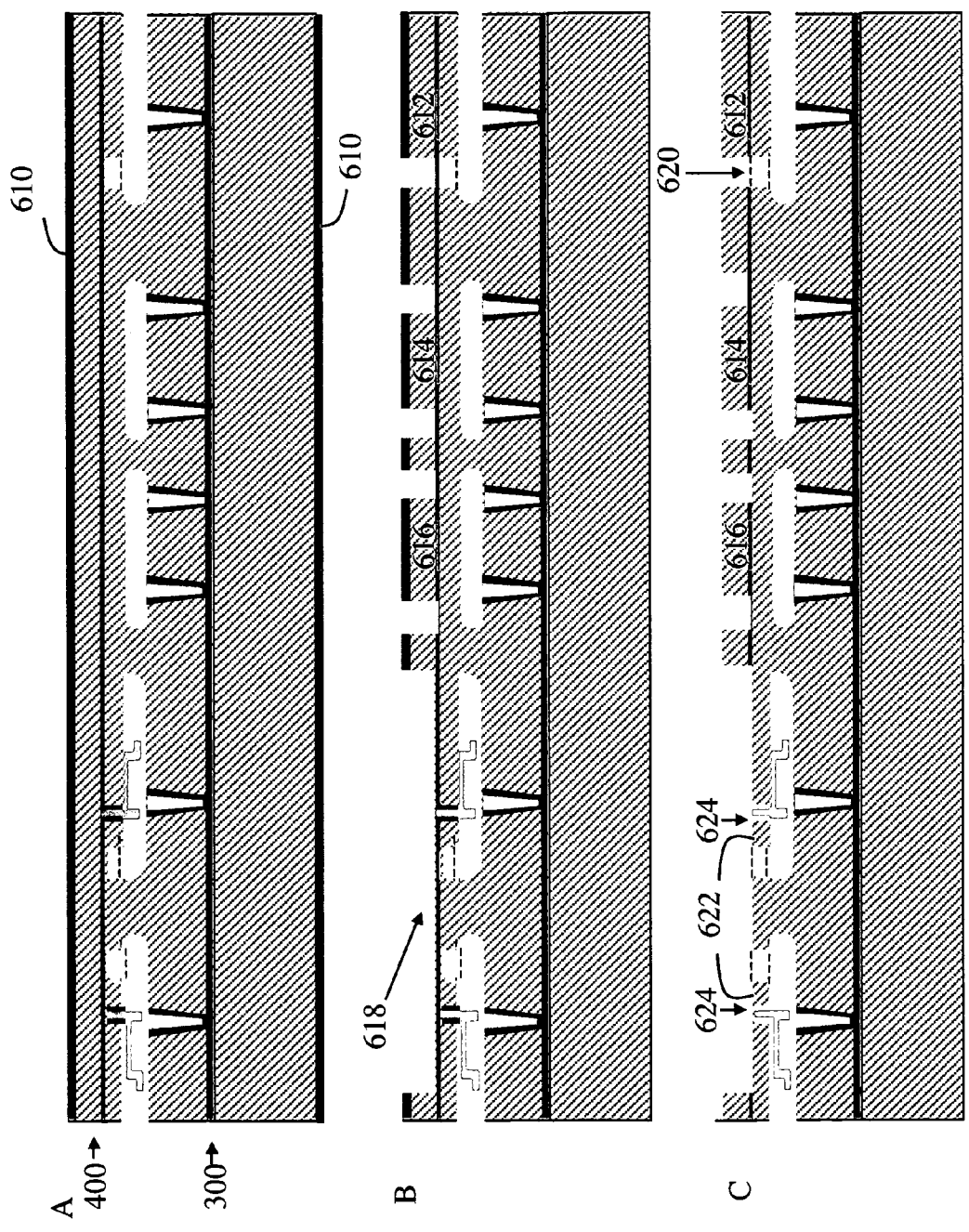

An oxide etch is now performed on the combined wafer to remove the thin oxide layers that hold the resonator in place and support the springs of the motion sensor. The etch is timed so as to allow full removal of oxide under and around the structures; in this case a minimum of 4.5 µm around the resonator must be removed. Typical methods of performing this etch are by using a wet HF process or by placing the wafer in a sealed container into which HF vapor is introduced. FIG. 6C illustrates the results of this process, with support springs 620, resonator body 622, and resonator gaps 624 indicated.

Figure 7:
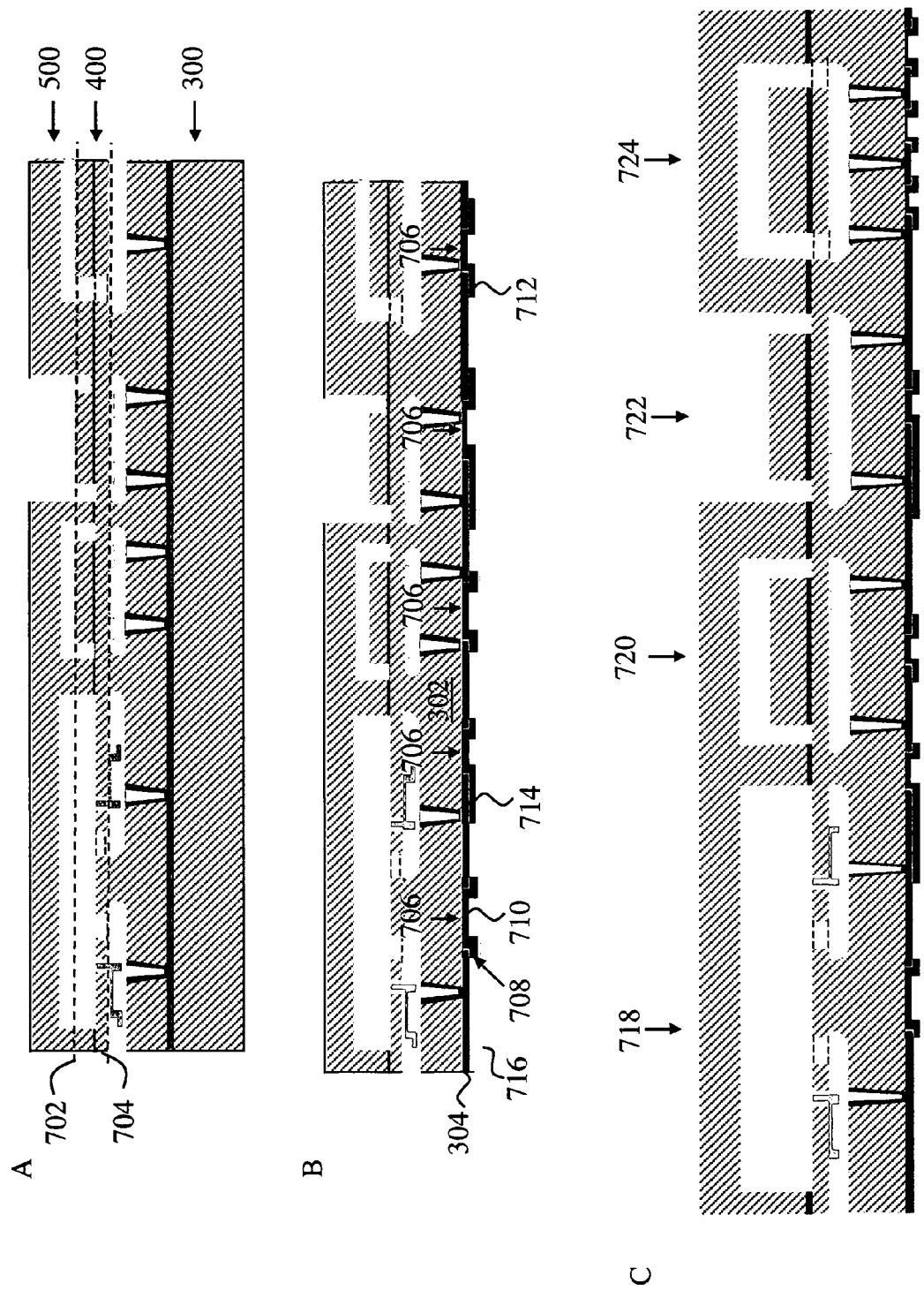

The free surface of the sensor wafer 400 is now prepared for silicon-to-silicon fusion bonding. Any of the available methods may be used but a preferred method is by introducing the wafer into an $O_2$ plasma. In preparation for bonding, the oxide 510 on the cap wafer 500 is removed and the underlying silicon surface is prepared for silicon-to-silicon fusion bonding. This surface preparation can use any of the methods described previously. The cap wafer 500 is then bonded to the free surface of the sensor wafer 400 under vacuum (FIG. 7A). (The boundary between the sensor wafer 400 and the cap wafer 500 is indicated by dotted line 702. The boundary between the sensor wafer 400 and the via wafer 300 is indicated by dotted line 704.)

Once the wafers have been bonded, the back of the via wafer 300 is ground and polished until the buried oxide layer 304 is reached (FIG. 7B). The oxide layer 304 provides an effective end stop to the polish process. Conventional photolithographic techniques are used to define contact holes 706 which are then etched into the oxide layer 304 using standard oxide etching techniques, exposing the underlying silicon 302 and allowing the electrically isolated areas of silicon 302 to be individually contacted. A layer of contact metal 708 is sputtered on the back of the wafer. Such a metal layer could be, for example, aluminum (Al) but may also be other metal layers well known in the silicon processing industry. Photolithography is used to pattern this metal layer to provide contacts 710, traces 712 and pads 714. A passivation/anti-scratch coating layer 716 is then applied over the metal 708. Such a coating layer may be a deposited oxide or nitride, for example PECVD silicon nitride, or may be a polymer layer such as spin-on, photodefineable polyimide. The coating layer is patterned by photolithographic techniques to expose the metal contact pads 714. An example of a completed MEMS chip with resonator 718, reference capacitor 720, pressure sensor 722 and motion sensor 724 is shown in FIG. 7C.

It will be apparent to anyone skilled in the art that suitable structures such as alignment marks need to be defined on the wafers to facilitate front and back side processing and wafer alignment during bonding. Such structures are well established and are therefore not described in detail.

Fabrication of an ASIC Chip

Figure 8:
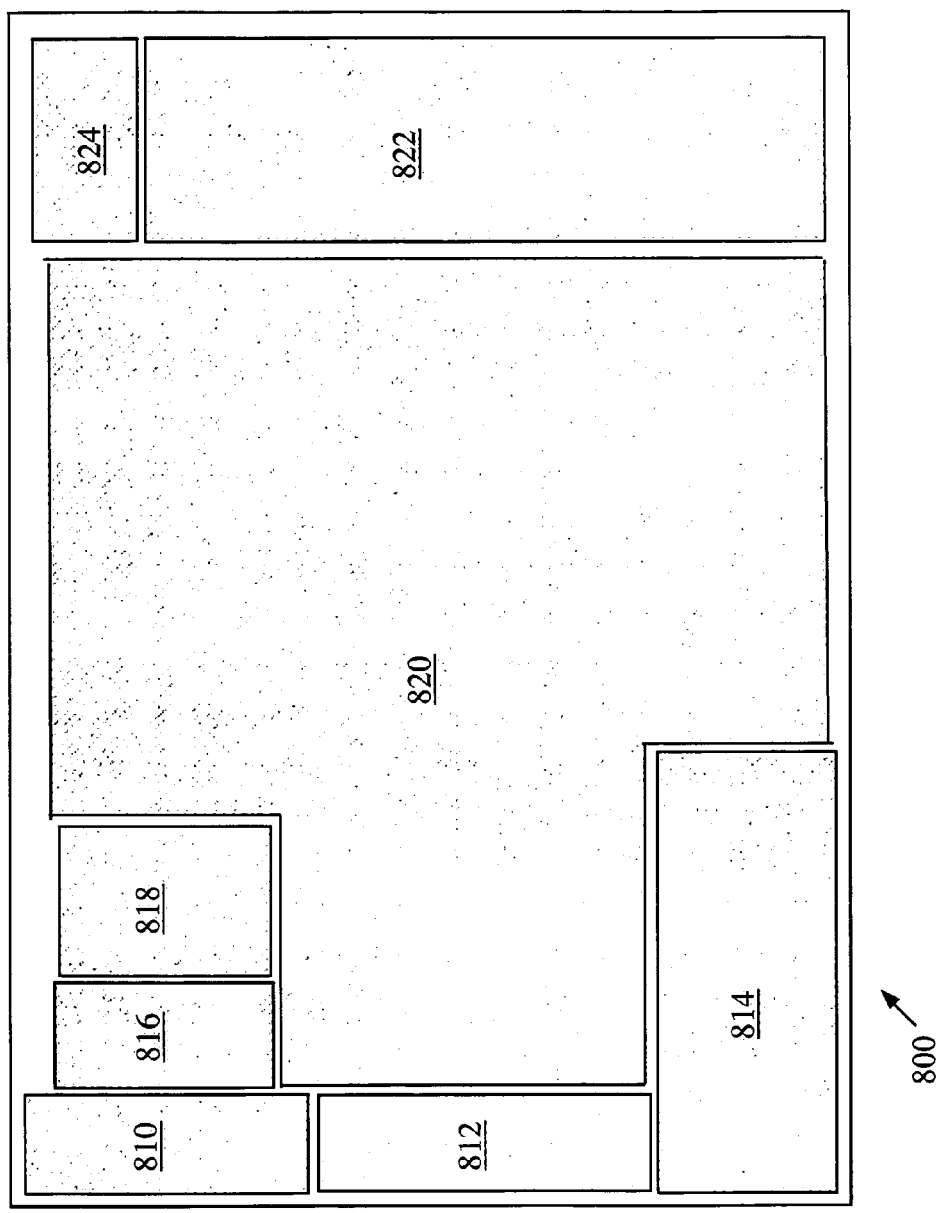
FIG. 8 shows an ASIC (Application Specific Integrated Circuit) chip according to the present invention.

FIG. 8 shows a preferred ASIC floorplan 800 showing the positions of key functional blocks. Illustrated functional blocks include voltage regulator 810, fractional-N synthesizer 812, power amplifier and associated circuits 814, timer 816, LF receiver 818, microcontroller 820, signal processor 822, and polarization voltage generator 824. The ASIC fabrication process preferably supports mixed signal, RF and digital circuits. In addition, the ASIC preferably reliably operates at a 3V battery voltage and can preferably withstand voltage spikes resulting from transmitting if the antenna has been disconnected (for example during wafer probing). These voltage spikes typically may be around 5 V. A 0.35 μm CMOS process is a preferred process that meets these objectives. Using this process, a monolithic ASIC chip, such as that used in the two-chip embodiment of the tire pressure sensor system shown in FIG. 2, can be fabricated that is between about 5 mm$^2$ and about 20 mm$^2$ in size.

The ASIC chip contains a large number of functional blocks. Each of the blocks is a standard IC function and most of these functions are commercially available. It has been possible to integrate all of the blocks onto a single monolithic ASIC chip by utilizing a CMOS process with mixed signal, RF and digital circuits capability. All of the circuits were optimized for the lowest possible energy consumption, to extend the battery life, applying whenever possible known design approaches to the circuitry, such as selecting the geometry of the transistors to operate at the lowest operating currents and by characterizing them at minimum operating voltage for the selected CMOS process.

While most of the blocks on the ASIC were typical in size and did not contribute to size reduction, changes were made to the MEMS sensor circuitry. These changes enabled the sensor circuitry to be designed into a small area, thus reducing the size of the ASIC chip.

On the sensor analog circuitry a number of methods were used to reduce the size. A common analog to digital converter was used for several measurement functions, such as the battery voltage sensor, temperature sensor, pressure sensor and motion sensor. In addition, the measurement function circuits were constructed such that common resources such as the bias current generator, reference voltage generator and clocking circuits were shared by all of the above sensors. This avoids the duplication of circuitry for each sensor and helped to minimize the overall circuit size.

For pressure measurement, very low noise input amplifiers, which generally are very large, were avoided and instead a higher sigma-delta over-sampling ratio was chosen to achieve the same noise-free resolution. This reduced the signal bandwidth, which was actually a benefit because it allows pressure noise to be filtered out.

In addition, a very compact second order infinite impulse response (IIR) digital filter was used for converting serial bitstream data from the sigma delta converter to parallel form. IIR filters are much smaller in size than finite impulse response filters (FIR), but at the expense of lost flexibility for bandwidth control and poles location, neither of which is important for the tire pressure sensing application. This form of filter design was chosen to enable a size reduction in the sensor circuitry. The size reduction is achieved as a result of replacing the multiplication used in finite response filters with simple shifting in the IIR filter, significantly reducing the gate count, and thus the size of the filter. In the tire pressure sensing application, this removed about 8000 gates, reducing sensor signal conditioning circuitry area by approximately 20% to 25%.

Fabrication of an Integrated Tire Pressure Sensor System on a Chip

Two approaches exist for the manufacture of a single integrated tire pressure sensor system chip. The first approach is to use a process that includes both the MEMS and the CMOS process steps. Examples in which such a process has been used include acceleration sensors from Analog devices and Elmos ("A Single Chip Pressure Sensor for the Automotive Market", Jeffery G. Markle et al., Sensors Magazine, April 2004 edition) and digital light projection (DLP) display chips from TI. This approach requires the elimination of processes that are not compatible with very large scale integration. The MEMS process described earlier eliminates the use of wet silicon etch processes and replaces them with dry processes, such as deep reative ion etching (DRIE), which are compatible with IC processes.

In the MEMS design described previously, the IC circuit could be fabricated by making modifications to the process described. The etch of feature 514, shown in FIG. 5D would not be performed until later in the process and via wafer 300 in FIG. 7A would not be ground all the way to buried oxide layer 304. Only the majority of via wafer 300 would be ground, leaving a thin silicon layer, for example 10 microns in thickness, over the buried oxide layer 304. At this stage the bonded wafers would appear as a featureless silicon wafer, suitable for introduction into a standard wafer fabrication process, and the CMOS circuitry could then be formed in wafer 300. After formation of the CMOS circuitry the IC circuits could be connected with the MEMS electrodes underneath oxide layer 304 by performing an etch through the silicon wafer 300 and the oxide layer 304, for example using DRIE and oxide etch, followed by metallization in a similar manner as shown in FIG. 7B. The final step would be to etch the cavity 514 on the exposed face of cap wafer 500.

An alternative approach, which is more suitable for integrating the combined MEMS device without any changes to the MEMS process, is to use vertical wafer integration, such as MEMS-on-IC or IC-on-MEMS, as described in the article in EE Times Online, "MEMS-IC Integration remains a challenge", by Janusz Bryzek, published online on Oct. 3, 2003. This could be achieved by forming underbump metallization (UBM) on selected exposed metal contacts 710 in FIG. 7B, processing the IC wafer in a similar manner to that described above for the ASIC chip, and connecting the MEMS wafer to the IC wafer using a standard flip chip approach.

Packaging of the Integrated Tire Pressure Sensor System

The integrated tire pressure sensor may be packaged using any package type, including, but not limited to, leadless (land grid array), ball grid array and quad flat pack (QFP) formats, molded, pre-molded, or with a cavity. Packaging methods include system-on-a-chip (SiP) and hybrid microcircuit-style packages. In a preferred embodiment, the ASIC and MEMS chips are mounted to a leadframe-based package that contains a hole, with the pressure sensing opening of the MEMS die mounted over the hole. This allows exposure of the pressure sensor on the MEMS chip to the environment through a pressure port. The MEMS chip is connected to the ASIC chip and connections to the leadframe are formed. Finally, a coating is placed over the MEMS chip, and a lid is attached to the package. These packaging steps are well known in the art and are thus not described in detail. Preferred package sizes include standard narrow body small outline integrated circuit (SOIC) packages or mid-sized or narrow bodied small shrunk outline package (SSOP), as described in JEDEC standards MS-013, MS-012 and MO-150.

Preferably, the package is relatively low in cost. Low cost packaging alternatives include SOIC, SSOP, and thin versions of these packages (TSOP and TSSOP). Such package styles, and others of a similar format, are known by the generic term of Small Outline Packages (SOP). A less preferred package is a ceramic package. Ceramic packages are reliable and provide good environmental resistance, but are more expensive.

Preferably, the package can operate in extreme environments, such as those encountered in a tire. Also preferably, the package can withstand severe vibration and acceleration (high g's). Thus, the package preferably has leads. Alternatively, the package could be leadless with connections to a circuit board, such as a Quad Flat No-lead (QFN) package or a Dual Flat No-lead (DFN) package.

Figure 9:
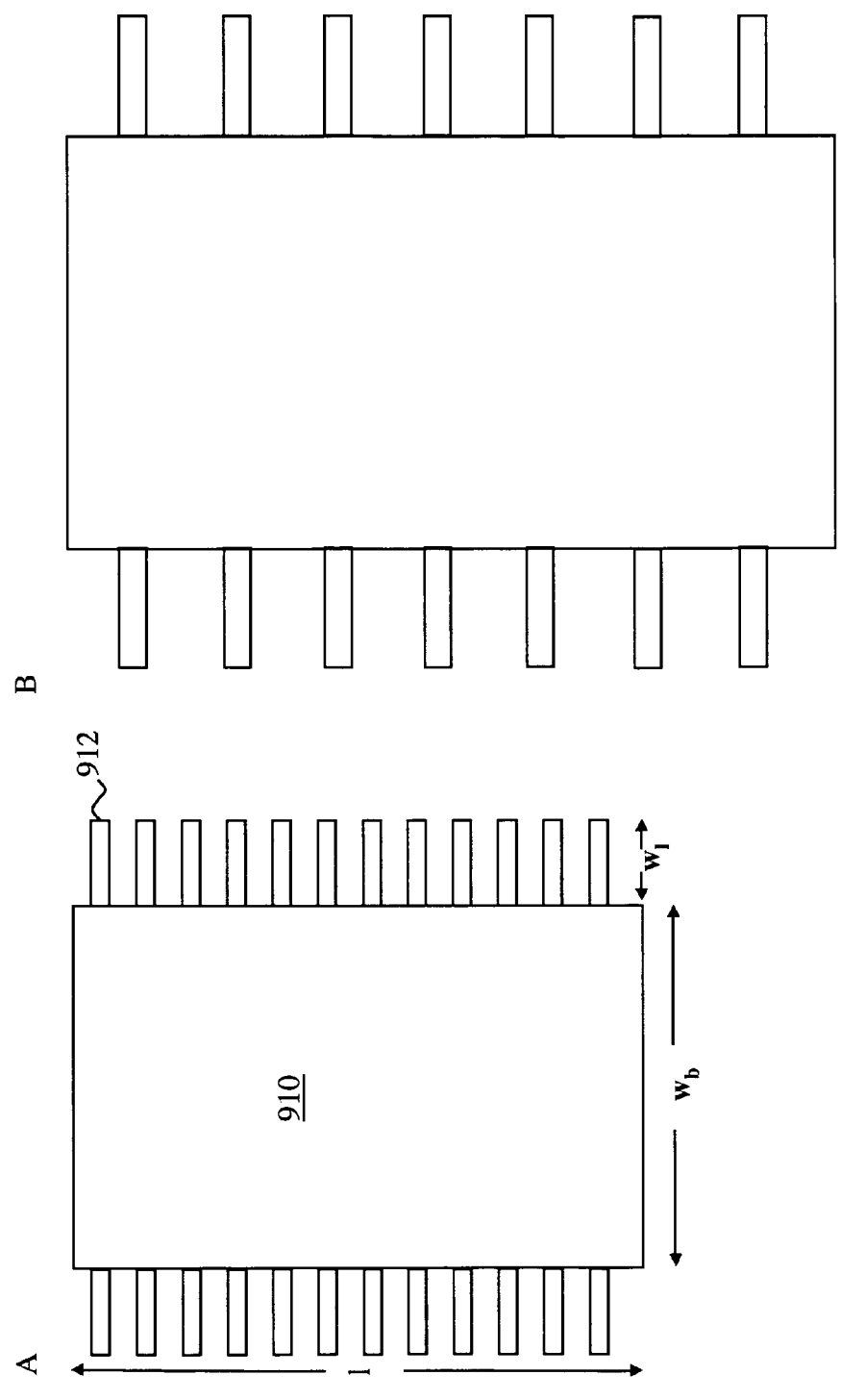
FIG. 9 shows scale drawings of a package according to the present invention and a prior art package.

Preferably, the package is low weight, as a lower weight reduces stresses caused by g-loading, shock and vibration. Preferably, the package weighs between about 0.1 g and about 0.75 g. In a preferred embodiment, the package has between 16 and 32 connections with a circuit board. More preferably, the package is a 24 pin (12 per side) shrunk small outline package (SSOP) that conforms to JEDEC standard MO-150 (FIG. 9A). Preferably, the width $W_b$ of the body 910 of the package is between about 5.0 mm and 5.6 mm, more preferably about 5.3 mm, and the width $w_l$ of the leads (pins) 912 is between about 0.9 mm and about 1.6 mm, more preferably about 1.25 mm. Preferably, the length l of the package is between about 7.9 mm and about 8.5 mm, more preferably about 8.2 mm. Thus, the overall package footprint on a board preferably requires an area of between about 7.4 mm to about 8.2 mm wide, more preferably about 7.8 mm wide, by about 7.9 mm to about 8.5 mm long, more preferably about 8.2 mm long.

In a preferred embodiment, the package contains at least one MEMS-based sensor, including a MEMS-based pressure sensor; a MEMS-oscillator-based wireless signal transmitter, including a MEMS-oscillator-based resonator, a fractional-N synthesizer and a power amplifier; and a microcontroller. Preferably, the package also contains a MEMS-based reference capacitor, a polarization voltage generator, a voltage sensor, a temperature sensor, a MEMS-based dual-axis or tri-axial motion sensor, a programming interface and a sensor signal processor.

In an alternative embodiment, the package contains at least one MEMS-based sensor, including a MEMS-based pressure sensor; a wireless signal transmitter, including a power amplifier; and a microcontroller. Preferably, the package also contains a MEMS-based reference capacitor, a voltage sensor, a temperature sensor, a MEMS-based dual-axis or tri-axial motion sensor, a fractional-N synthesizer and a sensor signal processor. In this embodiment, the package would be operably connected to an external resonator.

For comparison, the smallest existing package currently on the market (Sensonor™ SP12) requires a footprint on a board of about 9.5 mm wide (of which about 6 mm is body and 1.75 mm per side is leads) by about 11 mm long (FIG. 9B). In addition to being larger, the Sensonor package contains only an ASIC, a pressure sensor, a temperature sensor, a supply voltage sensor, and a one-dimensional motion sensor. The Sensonor package does not contain a resonator or a wireless signal transmitter.

In a preferred embodiment, the package has pin assignments as shown in FIG. 10, where GND is ground, PA is power amplifier, UART is Universal Asynchronous Receiver-Transmitter, and LF is low frequency. This configuration allows key functions, such as the power amplifier, to be isolated from adjacent functions by the use of ground pins. This configuration also enables the use of an optional external resonator with the tire pressure sensor system.

In a preferred embodiment, the package is mounted on a printed circuit board. Preferably, the circuit board is about 16 mm by about 19 mm. Preferably, this circuit board requires less than about 50 solder joints, allowing an increase in reliability of the system. In addition, the printed circuit board preferably includes less than about 8 external components that are not included in the package. These components may include the battery, capacitors, the LF pickup coils and an antenna.

The integrated tire pressure sensor system may be used in a variety of tire pressure sensing modules. Examples include modules that are assembled on the valve stem, the valve-stem cap, the wheel rim, or the tire itself. As such modules are known in the art, they will not be described in detail here.

As one of ordinary skill in the art will appreciate, the present invention is not limited to or defined by what is shown or described herein. One of ordinary skill in the art will appreciate that various changes, substitutions, and alterations could be made or otherwise implemented without departing from the principles of the present invention. Accordingly, the scope of the present invention should be determined by the following claims and their legal equivalents.

What is claimed is:

1. An integrated tire pressure sensor system, comprising:
   (a) one or more MEMS-based sensors, including a MEMS-based pressure sensor for sensing a pressure of a tire;
   (b) a MEMS-oscillator-based wireless signal transmitter for transmitting data generated by said MEMS-based pressure sensor, wherein said MEMS-oscillator-based wireless signal transmitter comprises:
      (i) a MEMS-oscillator-based resonator for generating a desired output frequency; and
      (ii) a fractional-N synthesizer to modify said desired output frequency of said MEMS-oscillator-based resonator; and
   (c) an asynchronous microcontroller;
   wherein said one or more MEMS-based sensors, said MEMS-oscillator-based wireless signal transmitter and said asynchronous microcontroller are integrated onto one or more chips in one or more packages.

2. The integrated tire pressure sensor system as set forth in claim 1, wherein said one or more MEMS-based sensors, said MEMS-oscillator-based wireless signal transmitter and said microcontroller are integrated onto one chip.

3. The integrated tire pressure sensor system as set forth in claim 1, wherein said one or more MEMS-based sensors, said MEMS-oscillator-based wireless signal transmitter and said microcontroller are integrated onto two chips.

4. The integrated tire pressure sensor system as set forth in claim 1, further comprising a MEMS-based reference capacitor for compensating said one or more MEMS-based sensors.

5. The integrated tire pressure sensor system as set forth in claim 1, further comprising one or more IC-based sensors.

6. The integrated tire pressure sensor system as set forth in claim 5, wherein said one or more IC-based sensors is selected from the group consisting of a voltage sensor and a temperature sensor.

7. The integrated tire pressure system as set forth in claim 1, wherein said one or more MEMS-based sensors are capacitive sensors.

8. The integrated tire pressure sensor system as set forth in claim 1, wherein said one or more MEMS-based sensors is selected from the group consisting of a tri-axial motion sensor, a dual-axis motion sensor, a gyroscope, a velocity sensor, a vacuum sensor, a force sensor, a light sensor and a temperature sensor.

9. The integrated tire pressure sensor system as set forth in claim 1, wherein said fractional-N synthesizer is operably connected to a temperature sensor for said modifying of said desired output frequency.

10. The integrated tire pressure sensor system as set forth in claim 1, wherein said fractional-N synthesizer is operably connected to a voltage sensor for said modifying of said desired output frequency.

11. The integrated tire pressure sensor system as set forth in claim 1, wherein said MEMS-oscillator-based resonator comprises a disc, a beam, a diaphragm, an annulus or a polyhedron.

12. The integrated tire pressure sensor system as set forth in claim 1, wherein said fractional-N synthesizer decreases variation of said output frequency of said MEMS-oscillator-based resonator to about ± 100ppm over a temperature range of about −40 ° C. to about 125 ° C.

13. The integrated tire pressure sensor system as set forth in claim 1, further comprising an ultra-compact battery, a MEMS-based energy scavenging system, or said ultra-compact battery and said MEMS-based energy scavenging system.

14. The integrated tire pressure sensor system as set forth in claim 1, wherein said one or more packages is one package.

15. The integrated tire pressure sensor system as set forth in claim 14, wherein said package is a Small Outline Package, a Dual Flat No-lead package or a Quad Flat No-lead package.

16. The integrated tire pressure sensor system as set forth in claim 1, further comprising a polarization voltage generator.

17. A method of sensing a pressure of a tire with an integrated tire pressure system, comprising:
   (a) integrating on one or more chips a plurality of components, including:
      (i) one or more MEMS-based sensors, including a MEMS-based pressure sensor;
      (ii) a MEMS-oscillator-based wireless signal transmitter, comprising:
         (a) a MEMS-oscillator-based resonator for generating a desired output frequency; and
         (b) a fractional-N synthesizer to modify said desired output frequency of said MEMS-oscillator-based resonator; and
      (iii) an asynchronous microcontroller;
   (b) sensing at least one parameter, including pressure of a tire, with at least one of said one or more MEMS-based sensors;
   (c) processing data generated by at least one of said one or more MEMS-based sensors with said microcontroller;
   (d) controlling the encoding and timing of transmission of pressure data generated by said MEMS-based pressure sensor with said microcontroller; and
   (e) transmitting pressure data generated by said MEMS-based pressure sensor using said MEMS-oscillator-based wireless signal transmitter.

18. The method as set forth in claim 17, wherein said one or more MEMS-based sensors, said MEMS-oscillator-based wireless signal transmitter and said microcontroller are integrated onto one chip.

19. The method as set forth in claim 17, wherein said one or more MEMS-based sensors, said MEMS-oscillator-based wireless signal transmitter and said MEMS-based microcontroller are integrated onto two chips.

20. The method as set forth in claim 17, further comprising integrating a MEMS-based reference capacitor for compensating said one or more MEMS-based sensors.

21. The method as set forth in claim 17, wherein said one or more MEMS-based sensors are capacitive sensors.

22. The method as set forth in claim 17, wherein said one or more MEMS-based sensors is selected from the group consisting of a tn-axial motion sensor, a dual-axis motion sensor, a velocity sensor, a gyroscope, a vacuum sensor, a force sensor, a light sensor and a temperature sensor.

23. The method as set forth in claim 17, wherein said fractional-N synthesizer utilizes data generated by a temperature sensor for said modifying of said desired output frequency.

24. The method as set forth in claim 17, wherein said fractional-N synthesizer utilizes data generated by a voltage sensor for said modifying of said desired output frequency.

25. The method as set forth in claim 17, wherein said MEMS-oscillator based resonator comprises a disc, a beam, a diaphragm, an annulus or a polyhedron.

26. The method as set forth in claim 17, wherein said fractionalN synthesizer decreases variation of said output frequency of said MEMS-oscillator-based resonator to about ±100 ppm over a temperature range of about −40 ° C. to about 125 ° C.

27. The method as set forth in claim 17, further comprising integrating an ultra-compact battery, a MEMS-based energy scavenging system, or an ultra-compact battery and a MEMS-based energy scavenging system into said integrated tire pressure sensor system.

28. The method as set forth in claim 17, further comprising integrating a polarization voltage generator into said integrated tire pressure sensor system.

29. An integrated tire pressure sensor system, comprising:
   (a) one or more MEMS-based sensors, including a MEMS-based pressure sensor for sensing a pressure of a tire;
   (b) a wireless signal transmitter for transmitting data generated by said MEMS-based pressure sensor, wherein said wireless signal transmitter comprises:
      (i) a MEMS-oscillator-based resonator for generating a desired output frequency; and
      (ii) a fractional-N synthesizer to modify said desired output frequency of said MEMS-oscillator-based resonator; and
   (c) an asynchronous microcontroller;
   wherein said one or more MEMS-based sensors, said power amplifier and said microcontroller are integrated onto one or more chips in one package.

30. The integrated tire pressure sensor system as set forth in claim 29, wherein said package further includes a MEMS-based reference capacitor for compensating said one or more MEMS-based sensors.

31. The integrated tire pressure sensor system as set forth in claim 29, wherein said one or more MEMS-based sensors is selected from the group consisting of a tri-axial motion sensor, a dual-axis motion sensor, a gyroscope, a velocity sensor, a vacuum sensor, a force sensor, a light sensor and a temperature sensor.

32. The integrated tire pressure sensor system as set forth in claim 29, wherein said package is a Small Outline Package, a Dual Flat No-lead package or a Quad Flat No-lead package.

* * * * *